United States Patent
Jin et al.

(10) Patent No.: US 9,673,236 B2
(45) Date of Patent: Jun. 6, 2017

(54) PIXEL ARRAY OF AN IMAGE SENSOR AND IMAGE SENSOR

(71) Applicant: SAMSUNG ELECTRONICS CO., LTD., Suwon-si (KR)

(72) Inventors: Hyun-Jong Jin, Gwacheon-si (KR); Tae-Chan Kim, Yongin-si (KR); Dong-Ki Min, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 69 days.

(21) Appl. No.: 14/661,161

(22) Filed: Mar. 18, 2015

(65) Prior Publication Data

US 2015/0311243 A1  Oct. 29, 2015

(30) Foreign Application Priority Data

Apr. 29, 2014  (KR) .......................... 10-2014-051366

(51) Int. Cl.
*H04N 5/369* (2011.01)
*H01L 27/146* (2006.01)
*H04N 9/04* (2006.01)

(52) U.S. Cl.
CPC .... *H01L 27/14607* (2013.01); *H01L 27/1461* (2013.01); *H01L 27/14609* (2013.01); *H01L 27/14621* (2013.01); *H01L 27/14643* (2013.01); *H01L 27/14645* (2013.01); *H04N 9/045* (2013.01); *H01L 27/14641* (2013.01)

(58) Field of Classification Search
CPC .......... H01L 27/14607; H01L 27/1461; H01L 27/14645; H01L 27/14609; H01L 27/14641; H01L 27/14643; H01L 27/14621; H04N 5/369
See application file for complete search history.

(56) References Cited

U.S. PATENT DOCUMENTS

| | | |
|---|---|---|
| 7,679,112 B2 | 3/2010 | Asaba |
| 7,741,664 B2 | 6/2010 | Choi et al. |
| 8,138,493 B2 | 3/2012 | Ohlsson et al. |
| 8,149,296 B2 | 4/2012 | Oshikubo et al. |
| 8,507,840 B2 | 8/2013 | Yu et al. |
| 2008/0290440 A1 | 11/2008 | Lee |
| 2009/0021629 A1 | 1/2009 | Yamada |
| 2011/0285881 A1 | 11/2011 | Izuha et al. |
| 2013/0193311 A1 | 8/2013 | Yoshida |

FOREIGN PATENT DOCUMENTS

| | | |
|---|---|---|
| JP | 2009-296276 A | 12/2009 |
| JP | 2012-84814 A | 4/2012 |

OTHER PUBLICATIONS

US 7,839,440, 11/2010, Kido et al. (withdrawn)
Jia Zhu et al., Optical Absorption Enhancement in Amorphous Silicone Nanowire and Nanocone Arrays, Dec. 10, 2008, Nano Letters, 2009 vol. 9, No. 1, 279-282.*

* cited by examiner

*Primary Examiner* — Padma Haliyur
(74) *Attorney, Agent, or Firm* — Sughrue Mion, PLLC

(57) ABSTRACT

A pixel array of an image sensor includes a substrate, a chromatic pixel including a first photodiode formed in the substrate and a color filter formed over the first photodiode, and an achromatic pixel including a second photodiode formed in the substrate, the second photodiode having a nano pillar pattern at a surface region of the substrate.

19 Claims, 12 Drawing Sheets

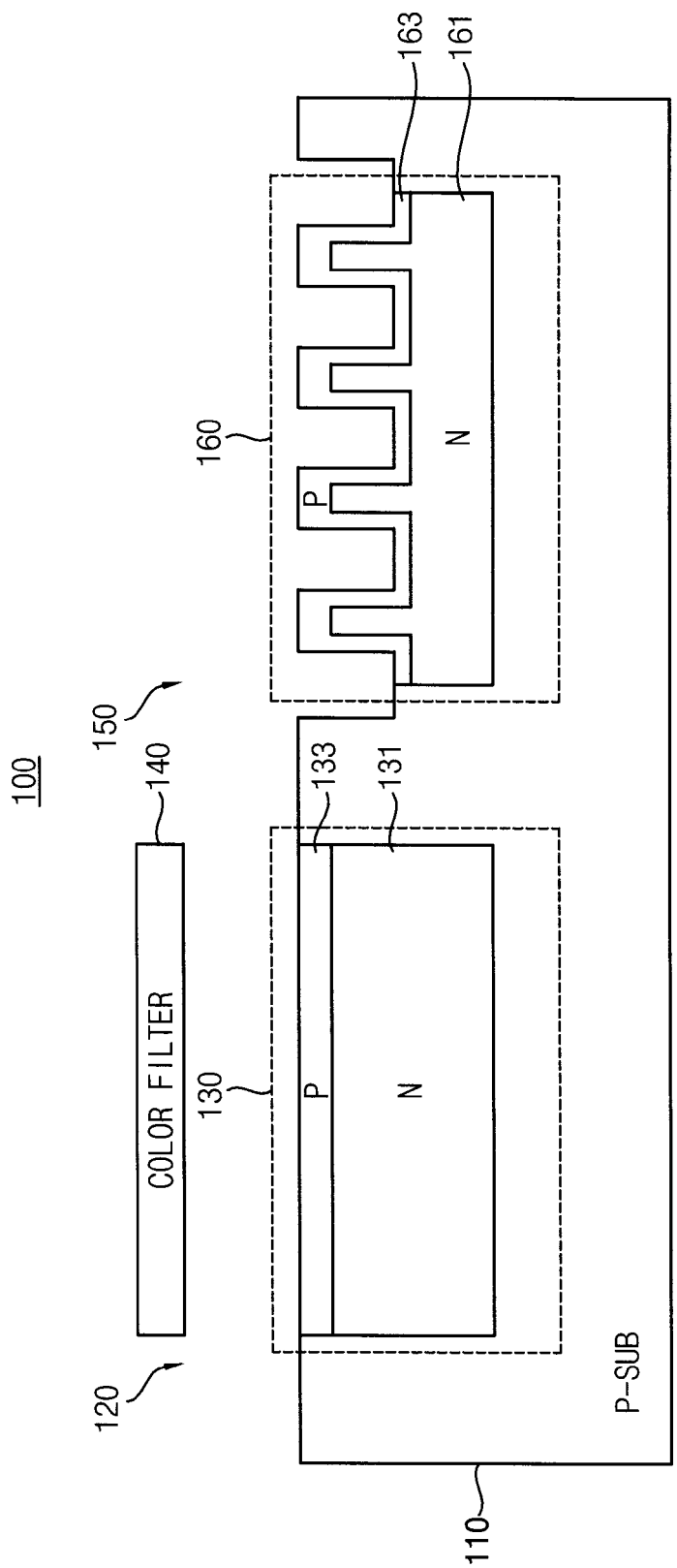

PIXEL ARRAY OF AN IMAGE SENSOR AND IMAGE SENSOR

CROSS-REFERENCE TO RELATED APPLICATIONS

This U.S. non-provisional application claims priority under 35 U.S.C. §119 to Korean Patent Application No. 10-2014-0051366 filed on Apr. 29, 2014 in the Korean Intellectual Property Office (KIPO), the entire contents of which is incorporated by reference herein in its entirety.

BACKGROUND

1. Technical Field

Exemplary embodiments relate generally to image sensors and, more particularly, to pixel arrays of image sensors including chromatic pixels and achromatic pixels and the image sensors.

2. Description of the Related Art

An image sensor is a photo-detection device that converts optical signals including image information of an object into electrical signals, and has been widely used in electronic devices, such as a digital camera, a smart phone, etc. Various types of image sensors, such as charge-coupled device (CCD) image sensors, CMOS image sensors (CIS), etc., have been developed to provide high quality image information of the object. Recently, the CIS is primarily used because of its advantages, such as high density, low power consumption, low cost, etc.

SUMMARY

Exemplary embodiments may provide a pixel array of an image sensor having high optical absorption and a wide dynamic range.

Exemplary embodiments may further provide an image sensor having high optical absorption and a wide dynamic range.

According to an aspect of an exemplary embodiment, there is provided a pixel array of an image sensor, the pixel array including a substrate, a chromatic pixel including a first photodiode formed in the substrate and a color filter formed over the first photodiode, and an achromatic pixel including a second photodiode formed in the substrate, the second photodiode having a nano pillar pattern at a surface region of the substrate.

The nano pillar pattern may include a plurality of cylindrical-shaped nano pillars.

A diameter of each of the cylindrical-shaped nano pillars may range from about 10 nm to about 100 nm, and a height of each of the cylindrical-shaped nano pillars may range from about 100 nm to about 1000 nm A pitch between two of the plurality of nano pillars may range from about 30 nm to about 300 nm.

The nano pillar pattern may include a plurality of conical-shaped nano pillars.

The nano pillar pattern may include a plurality of nano pillars each having a polygonal cylinder shape or a polygonal cone shape.

The first photodiode may include a first doped region having a second conductivity type, the first doped region being formed in the substrate having a first conductivity type, the first doped region including a flat surface, and a second doped region having the first conductivity type, the second doped region being formed on the flat surface of the first doped region.

The second photodiode may include a third doped region having a second conductivity type, the third doped region being formed in the substrate having a first conductivity type, the third doped region including a surface having a shape corresponding to the nano pillar pattern, and a fourth doped region having the first conductivity type, the fourth doped region being formed on the surface having the shape corresponding to the nano pillar pattern.

The chromatic pixel may be configured to generate luminance information and color information, and the achromatic pixel may be configured to generate luminance information.

A dynamic range of the luminance information generated by the achromatic pixel may be wider than a dynamic range of the luminance information generated by the chromatic pixel.

The pixel array may include at least one of a red pixel, a green pixel and a blue pixel as the chromatic pixel, and at least one white pixel as the achromatic pixel.

The pixel array may include at least one of a cyan pixel and a yellow pixel as the chromatic pixel, and at least one white pixel as the achromatic pixel.

According to another aspect of an exemplary embodiment, there is provided an image sensor including a substrate, a pixel array including a chromatic pixel and an achromatic pixel, the chromatic pixel including a first photodiode formed in the substrate and a color filter formed over the first photodiode, the achromatic pixel including a second photodiode formed in the substrate, and the second photodiode having a nano pillar pattern at a surface region of the substrate, and a control unit configured to control the pixel array.

The nano pillar pattern may include a plurality of nano pillars, each of the nano pillars having a circular cylinder shape, a circular cone shape, a polygonal cylinder shape or a polygonal cone shape.

The first photodiode may include a first doped region having a second conductivity type, the first doped region being formed in the substrate having a first conductivity type, the first doped region including a flat surface, and a second doped region having the first conductivity type, the second doped region being formed on the flat surface of the first doped region, and the second photodiode may include a third doped region having the second conductivity type, the third doped region being formed in the substrate, the third doped region including a surface having a shape corresponding to the nano pillar pattern, and a fourth doped region having the first conductivity type, the fourth doped region being formed on the surface having the shape corresponding to the nano pillar pattern.

BRIEF DESCRIPTION OF THE DRAWINGS

Illustrative, non-limiting exemplary embodiments will be more clearly understood from the following detailed description taken in conjunction with the accompanying drawings of which:

FIG. 1 is a cross-sectional diagram illustrating a chromatic pixel and an achromatic pixel included in a pixel array of an image sensor according to an exemplary embodiment;

DETAILED DESCRIPTION OF THE EXEMPLARY EMBODIMENTS

Figure 2A:
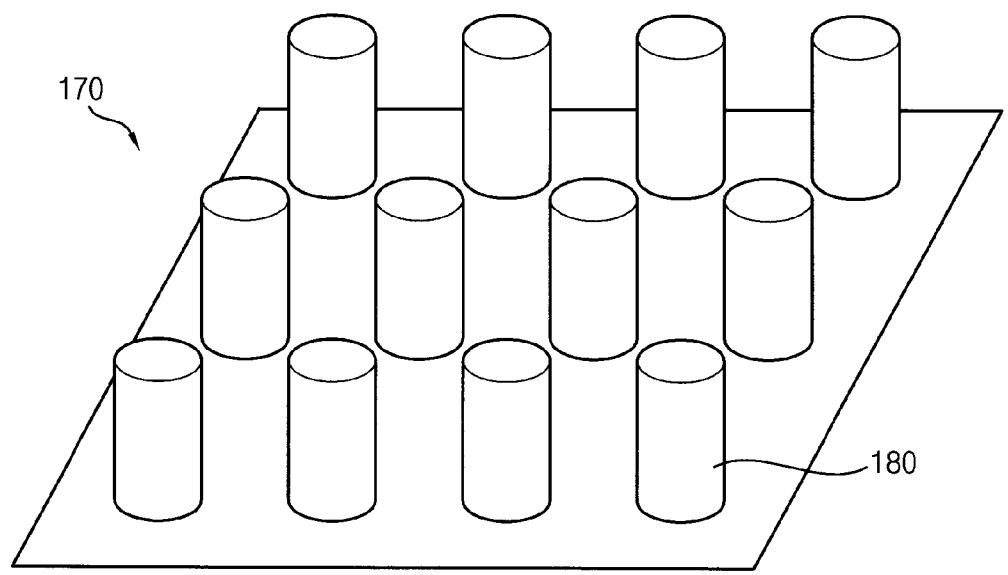
FIGS. 2A and 2B are diagrams illustrating an example of a nano pillar pattern illustrated in FIG. 1.

Various exemplary embodiments will be described more fully hereinafter with reference to the accompanying drawings, in which some exemplary embodiments are shown. The exemplary embodiments may, however, be embodied in many different forms and should not be construed as being limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional diagram illustrating a chromatic pixel and an achromatic pixel included in a pixel array of an image sensor according to an exemplary embodiment.

Referring to FIG. 1, a pixel array 100 of an image sensor includes a chromatic pixel 120 that generates luminance information (or light-and-shade information) and color information, and an achromatic pixel 150 that generates luminance information. Although FIG. 1 illustrates one chromatic pixel 120 and one achromatic pixel 150 for convenience of illustration, the pixel array 100 of the image sensor may include a plurality of chromatic pixels and a plurality of achromatic pixels.

The chromatic pixel 120 may include a first photodiode 130 formed in a substrate 110 and a color filter 140 formed over the first photodiode 130. In some exemplary embodiments, each chromatic pixel 120 included in the pixel array 100 may be one of a red pixel, a green pixel and a blue pixel. Thus, in this case, the color filter 140 may be a red color filter that transmits red light, a green color filter that transmits green light, or a blue color filter that transmits blue light. In other exemplary embodiments, each chromatic pixel 120 included in the pixel array 100 may be one of a cyan pixel and a yellow pixel. In this case, the color filter 140 may be a cyan color filter that transmits cyan light, or a yellow color filter that transmits yellow light. The chromatic pixel 120 may convert incident light passing through the color filter 140 into an electrical signal, and thus may provide the color information as well as the luminance information (or the light-and-shade information).

The first photodiode 130 of the chromatic pixel 120 may have a substantially flat upper surface. For example, the first photodiode 130 of the chromatic pixel 120 may include a first doped region 131 having a second conductivity type (e.g., an N type) formed in the substrate 110 having a first conductivity type (e.g., a P type), and the first doped region 131 may have a substantially flat upper surface. The first photodiode 130 may further include a second doped region 133 having the first conductivity type and being formed on the flat upper surface of the first doped region 131, and thus the second doped region 133 may also have a substantially flat upper surface. Since the first photodiode 130 of the chromatic pixel 120 has the substantially flat upper surface, the color filter 140 may be readily formed over the first photodiode 130, and a manufacturing process may be simplified. Although FIG. 1 illustrates an example where the first substrate 110 and the second doped region 133 have the P type, and the first doped region 131 has the N type, in other exemplary embodiments, the first substrate 110 and the second doped region 133 have the N type, and the first doped region 131 has the P type.

The achromatic pixel 150 may include a second photodiode 160 formed in the substrate 110, and may not include a color filter. Since the achromatic pixel 150 has no color filter, the achromatic pixel 150 may receive incident light without optical loss by the color filter, and may generate the luminance information (or the light-and-shade information) with a wide dynamic range.

The second photodiode 160 of the achromatic pixel 150 may have a nano pillar pattern at a surface region of the substrate 110. The nano pillar pattern of the second photodiode 160 may have various shapes according to exemplary embodiments. In some exemplary embodiments, the nano pillar pattern may include a plurality of cylindrical-shaped nano pillars. That is, each nano pillar may have a circular cylinder shape having a circular cross-section. In other exemplary embodiments, the nano pillar pattern may include a plurality of conical-shaped nano pillars. That is, each nano pillar may have a circular cone shape having a circular cross-section that gradually decreases. In still other exemplary embodiments, the nano pillar pattern may include a plurality of nano pillars each having a polygonal (e.g., triangular, quadrangular, pentagonal, hexagonal, or the like) cylinder shape or a polygonal cone shape. For example, the second photodiode 160 of the achromatic pixel 150 may include a third doped region 161 having the second conductivity type (e.g., the N type) formed in the substrate having the first conductivity type (e.g., the P type), and the third doped region 161 may have an upper surface having a shape corresponding to the nano pillar pattern. The second photodiode 160 of the achromatic pixel 150 may further include a fourth doped region 163 having the first conductivity type formed on the upper surface having the shape corresponding to the nano pillar pattern, and thus the fourth doped region 163 may also have an upper surface having a shape corresponding to the nano pillar pattern. Although FIG. 1 illustrates an example where the first substrate 110 and the fourth doped region 163 have the P type, and the third doped region 161 has the N type, in other exemplary embodiments, the first substrate 110 and the fourth doped region 163 have the N type, and the third doped region 161 has the P type.

Since the second photodiode 160 has the nano pillar pattern at the surface region of the substrate 110, an area of a P-N junction between the third doped region 161 and the fourth doped region 163 may be increased, and thus optical absorption of the second photodiode 160 for incident light may be increased compared with a typical photodiode having a flat upper surface. Further, since the second photodiode 160 has the nano pillar pattern at the surface region of the substrate 110, the incident light may be scattered by the nano pillar pattern, and the scattered light may be absorbed by the second photodiode 160. Accordingly, the optical absorption of the second photodiode 160 may be further increased. A typical photodiode has relatively low optical absorption with respect to light having low luminance. However, the second photodiode 160 may have high optical absorption with respect to not only light having high luminance, but also the light having low luminance. Accordingly, the achromatic pixel 150 including the second photodiode 160 may generate the luminance information having the wider dynamic range compared with a pixel including a typical photodiode or the chromatic pixel 120 including the first photodiode 130. As described above, the second photodiode 160 includes not only a P-N junction between the substrate 110 and the third doped region 161 suitable for generating photo-charges by absorbing light having a high luminance, but also includes the P-N junction between the third doped region 161 and the fourth doped region 163 in the nano pillar pattern, and thus the second photodiode 160 may have high optical absorption for the light having low luminance as well as the light having high luminance, thereby having the wide dynamic range.

In some exemplary embodiments, to form the first photodiode 130 of the chromatic pixel 120 having the substantially flat upper surface and the second photodiode 160 of the achromatic pixel 150 having the nano pillar pattern at the surface region, a first ion implantation process that implants ions having the second conductivity type into the substrate 110 having the first conductivity type may be performed to form first and third doped regions 131 and 161 having substantially flat upper surfaces. Thereafter, a predetermined etching process may be performed such that a substrate surface region where the third doped region 161 is formed may be etched to have the nano pillar pattern. Thereafter, by performing a second ion implantation process that implants ions having the first conductivity type, the second doped region 133 having the substantially flat upper surface may be formed at the chromatic pixel 120, and the fourth doped region 163 having a shape corresponding to the nano pillar pattern may be formed at the achromatic pixel 150. Accordingly, the first photodiode 130 of the chromatic pixel 120 having the substantially flat upper surface and the second photodiode 160 of the achromatic pixel 150 having the nano pillar pattern at the surface region may be formed.

Eyes of a human have first cells that are suitable for light having high luminance and primarily generate color information and second cells that are suitable for light having low luminance and primarily generate luminance information (or light-and-shade information), and the first cells and the second cells have different shapes. Similarly, in the pixel array 100 of the image sensor according to exemplary embodiments, the first photodiode 130 of the chromatic pixel 120 and second photodiode 160 of the achromatic pixel 150 have different shapes from each other. As described above, since the first photodiode 130 of the chromatic pixel 120 has the substantially flat upper surface, the color filter 140 may be readily formed over the first photodiode 130. Further, since the second photodiode 160 of the achromatic pixel 150 has the nano pillar pattern, the area of the upper P-N junction of the second photodiode 160 may be increased, and the incident light scattered by the nano pillar pattern may be absorbed by the second photodiode 160, thereby improving the optical absorption of the image sensor according to exemplary embodiments and improving the dynamic range.

Figure 3A:
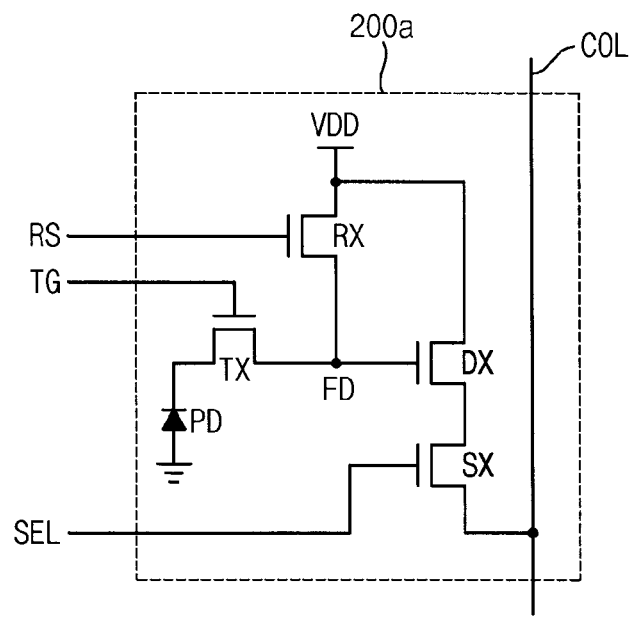
FIGS. 3A through 3D are circuit diagrams illustrating examples of each pixel included in a pixel array of an image sensor according to an exemplary embodiment.
Figure 3B:
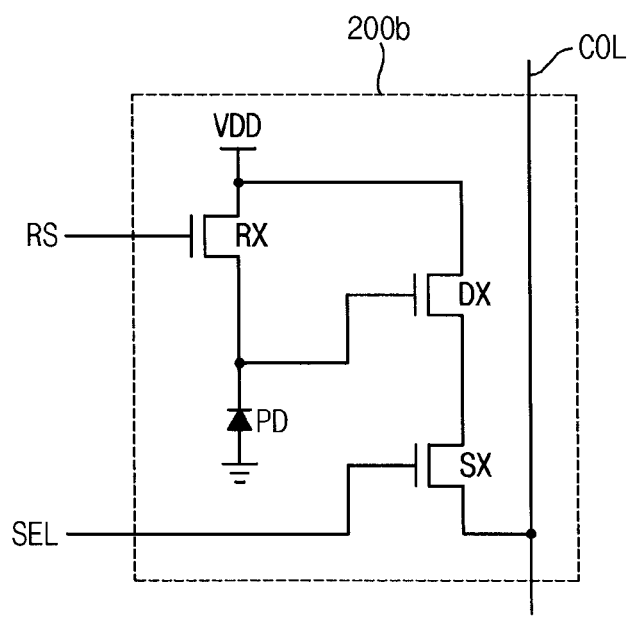
Figure 3C:
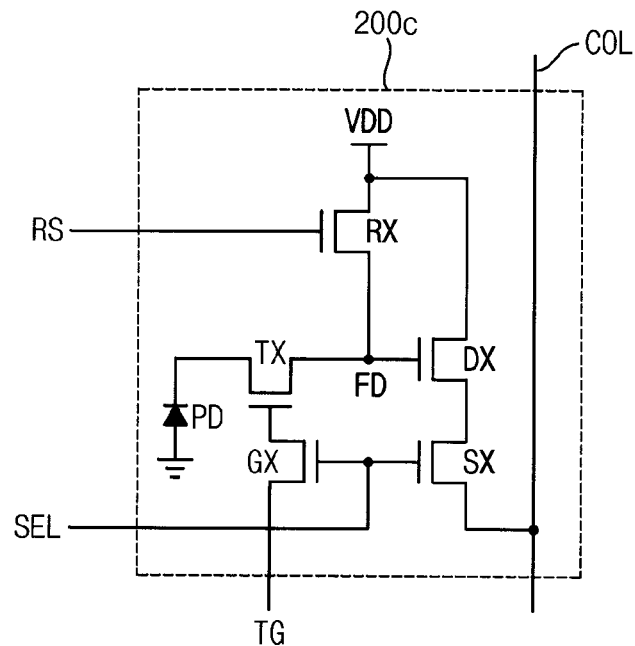
Figure 3D:
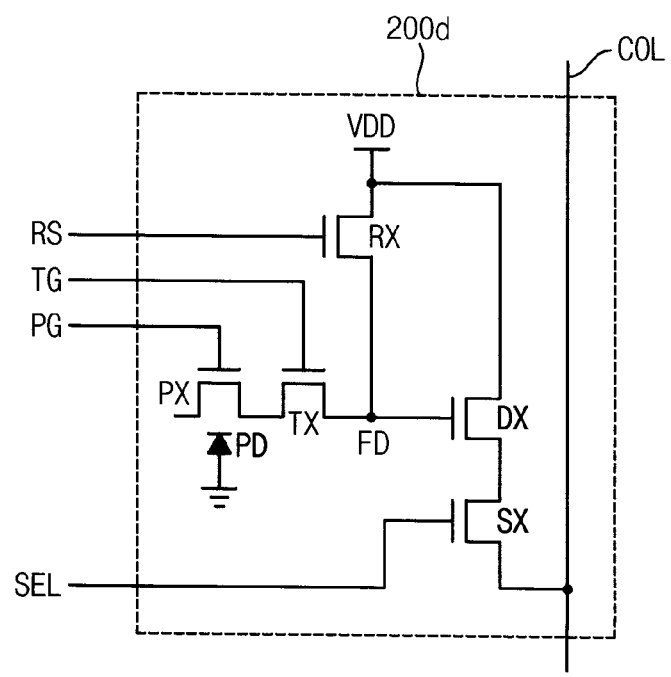
Figure 4:
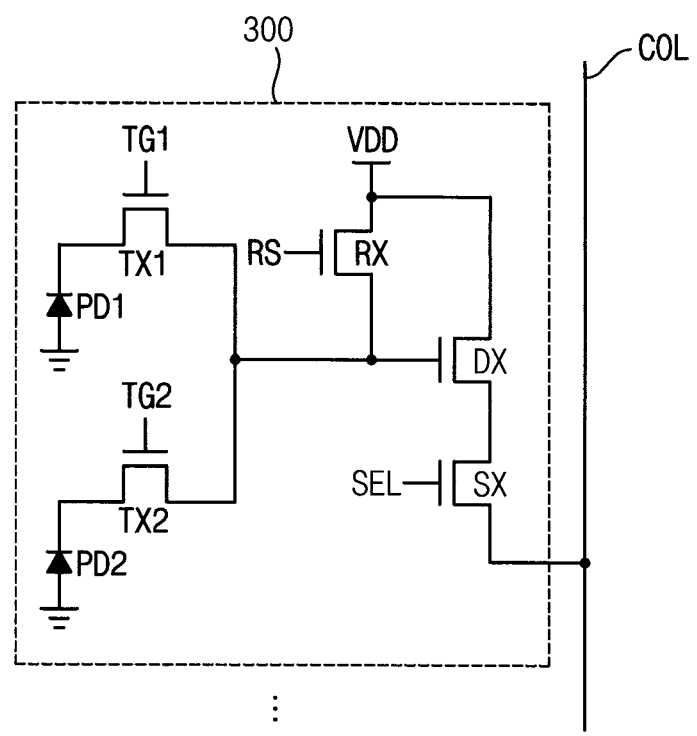
FIG. 4 is a circuit diagram illustrating an example where transistors are shared by at least two pixels included in a pixel array of an image sensor according to an exemplary embodiment.

Although only the photodiode 130 and 160 and the color filter 120 of each pixel 120 and 150 are illustrated in FIG. 1 for convenience of illustration, in some exemplary embodiments, as illustrated in FIGS. 3A through 4, each pixel 120 and 150 may further include a floating diffusion region and/or at least one transistor.

Figure 2B:
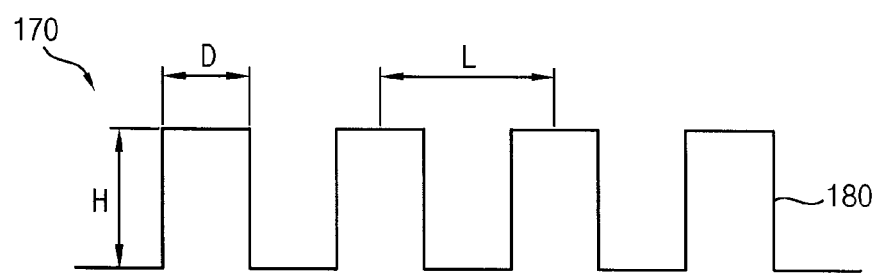

FIGS. 2A and 2B are diagrams illustrating an example of a nano pillar pattern illustrated in FIG. 1.

As illustrated in FIGS. 2A and 2B, at least a portion or all of achromatic pixels included in a pixel array of an image sensor according to exemplary embodiments may include a photodiode having a nano pillar pattern 170 at a substrate surface region. In some exemplary embodiments, the nano pillar pattern 170 may include a plurality of cylindrical-shaped nano pillars 180 that are arranged in a matrix form having a plurality of rows and a plurality of columns. Each nano pillar 180 may have a nano size. For example, a diameter D of each nano pillar 180 may range from about 10 nm to about 100 nm, and a height H of each nano pillar 180 may range from about 100 nm to about 1000 nm. Further, a pitch L (or a center-to-center distance between adjacent nano pillars 180) of the nano pillars 180 may range from about 30 nm to about 300 nm. Since each achromatic pixel includes the photodiode having the nano pillar pattern 170, the image sensor including the achromatic pixel may have the high optical absorption and the wide dynamic range.

Although FIGS. 2A and 2B illustrate an example of the nano pillar pattern 170 including the nano pillars 180 having the circular cylinder shape, according to exemplary embodiments, the nano pillars 180 may have various types of shapes. For example, the nano pillars 180 may have a circular cone shape, a polygonal (e.g., triangular, quadrangular, pentagonal, hexagonal, or the like) cylinder shape, a polygonal cone shape, or a combination thereof.

FIGS. 3A through 3D are circuit diagrams illustrating an example of each pixel included in a pixel array of an image sensor according to an exemplary embodiment.

Referring to FIG. 3A, each pixel 200a (e.g., a chromatic pixel or an achromatic pixel) included in a pixel array of an image sensor may include a photodiode PD as a photo sensitive device, and may further include a transfer transistor TX, a reset transistor RX, a drive transistor DX and a select transistor SX as a readout circuit.

The photodiode PD may generate photo-charges based on incident light. The photo-charges generated by the photodiode PD may be transferred to a floating diffusion node FD via the transfer transistor TX. For example, while a transfer control signal TG has a first level (e.g., a high level), the transfer transistor TX may be turned on, and thus the photo-charges generated by the photo sensitive device PD may be transferred to the floating diffusion node FD.

The drive transistor DX may serve as a source follower buffer amplifier, and may buffer a signal corresponding to charges collected in the floating diffusion node FD. The select transistor SX may transfer the amplified signal to a column line COL in response to a select signal SEL. The floating diffusion node FD may be reset by the reset transistor RX. For example, the reset transistor RX may reset the floating diffusion node FD with a fixed period for a CDS operation in response to a reset signal RS.

Although FIG. 3A illustrates a pixel 200a including one photodiode PD and four MOS transistors TX, RX, DX and SX, the pixels according to exemplary embodiments are not limited thereto, and the exemplary embodiments may, for example, be applied to any pixels including a photo sensitive device and at least three transistors. Other exemplary embodiments of the pixels are illustrated in FIGS. 3B through 4.

Referring to FIG. 3B, a pixel 200b may include a photodiode PD as a photo sensitive device, and may further include a reset transistor RX, a drive transistor DX and a select transistor SX as a readout circuit. Thus, the pixel 200b may have a three-transistor pixel structure.

Referring to FIG. 3C, a pixel 200c may include a photodiode PD as a photo sensitive device, and may further include a transfer transistor TX, a gate transistor GX, a reset transistor RX, a drive transistor DX and a select transistor SX as a readout circuit. Thus, the pixel 200c may have a five-transistor pixel structure. The gate transistor GX may selectively apply a transfer control signal TG to the transfer transistor TX in response to a select signal SEL.

Referring to FIG. 3D, a pixel 200d may include a photodiode PD as a photo sensitive device, and may further include a photo transistor PX (or a photogate), a transfer transistor TX, a reset transistor RX, a drive transistor DX and a select transistor SX as a readout circuit. Thus, the pixel 200d may have a five-transistor pixel structure. Further, the pixel 200d may have a six-transistor pixel structure which further includes a gate transistor GX or a bias transistor, in addition to the transistors shown in FIG. 3D. The photo transistor PX may be turned on or off in response to a photo gate signal PG. While the photo transistor PX is turned on, the photodiode PD may generate photo-charges by sensing incident light. While the photo transistor PX is turned off, the photodiode PD may not sense the incident light.

As illustrated in FIGS. 3A through 3D, each pixel may have various structures, and respective pixels may have independent structures. However, in some exemplary embodiments, as illustrated in FIG. 4, at least two pixels may share at least one component. For example, two or four pixels may include respective photodiodes PD and respective transfer transistors TX, and may share other transistors.

FIG. 4 is a circuit diagram illustrating an example where transistors are shared by at least two pixels included in a pixel array of an image sensor according to exemplary embodiments.

Referring to FIG. 4, an image sensor may include a shared pixel 300 where two or more pixels share a reset transistor RX, a drive transistor DX and a select transistor SX. Since the transistors RX, DX and SX are shared by the two pixels, a size of the photodiode PD may be increased, and thus a fill factor of the image sensor may be increased. According to exemplary embodiments, two or more chromatic pixels may share the transistors RX, DX and SX, two or more achromatic pixels may share the transistors RX, DX and SX, or at least one chromatic pixel and at least one achromatic pixel may share the transistors RX, DX and SX. In a case where the transistors RX, DX and SX are shared, transfer control signals TG1 and TG2 applied to the transfer transistors TX1 and TX2 may be activated in a time-division manner, and thus the photo-charges generated by the respective photodiodes PD1 and PD2 may be separately measured. Although FIG. 4 illustrates an example where two pixels share the transistors, in some exemplary embodiments, three or more pixels may share at least one transistor.

Figure 5:
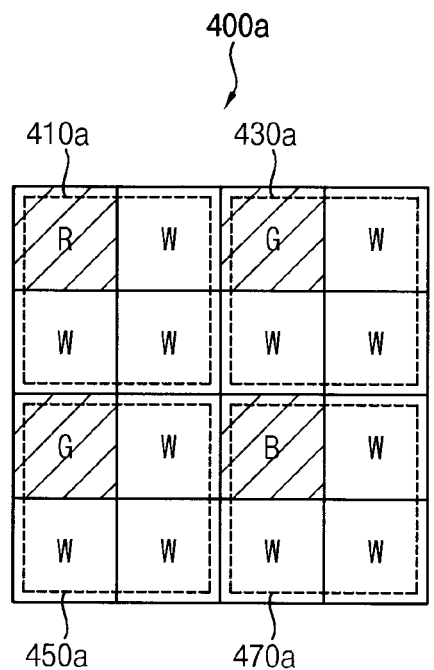
FIG. 5 is a diagram illustrating an example of a pixel array of an image sensor according to an exemplary embodiment.

FIG. 5 is a diagram illustrating an example of a pixel array of an image sensor according to an exemplary embodiment.

Referring to FIG. 5, a pixel array 400a of an image sensor may include a plurality of pixel groups 410a, 430a, 450a and 470a. In some exemplary embodiments, such as the exemplary embodiment illustrated in FIG. 5, each pixel R, G, B and W may have a rectangular shape, and the pixel groups 410a, 430a, 450a and 470a may be arranged in a matrix form having a plurality of rows and a plurality of columns. In other exemplary embodiments, each pixel R, G, B and W may have one of various shapes, such as any polygonal (e.g., triangular, quadrangular, pentagonal, hexagonal, or the like) shape, a circular shape, etc., and the pixel groups 410a, 430a, 450a and 470a may be arranged in one of various forms.

In some exemplary embodiments, such as the exemplary embodiment illustrated in FIG. 5, each pixel group 410a, 430a, 450a and 470a may include one chromatic pixel and three achromatic pixels. That is, each pixel group 410a, 430a, 450a and 470a may include one of a red pixel R, a green pixel G and a blue pixel B as the chromatic pixel, and three white pixels W as the achromatic pixels. For example, a first pixel group 410a may include a red pixel R and three white pixels W, a second pixel group 430a may include a green pixel G and three white pixels W, a third pixel group 450a may include a green pixel G and three white pixels W, and a fourth pixel group 470a may include a blue pixel B and three white pixels W. Each chromatic pixel, or each of the red pixel R, the green pixel G and the blue pixel B may include a photodiode having a substantially flat upper surface and a color filter above the photodiode. At least a portion or all of the achromatic pixels, or at least a portion or all of the white pixels W may include photodiodes having nano pillar patterns with no color filter. Accordingly, the pixel array 400a of the image sensor may have high optical absorption for light having high luminance and light having low luminance, and may have a wide dynamic range.

Figure 6:
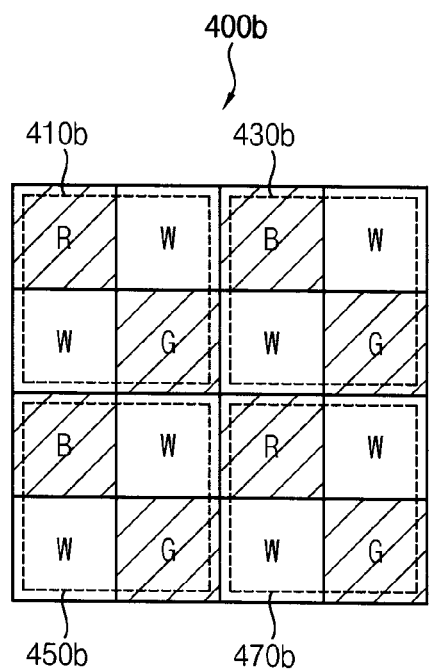
FIG. 6 is a diagram illustrating another example of a pixel array of an image sensor according to an exemplary embodiment.

FIG. 6 is a diagram illustrating another example of a pixel array of an image sensor according to an exemplary embodiment.

Referring to FIG. 6, a pixel array 400b of an image sensor may include a plurality of pixel groups 410b, 430b, 450b and 470b that are arranged in a matrix form having a plurality of rows and a plurality of columns.

In some exemplary embodiments, such as the exemplary embodiment illustrated in FIG. 6, each pixel group 410b, 430b, 450b and 470b may include two chromatic pixels and two achromatic pixels. That is, each pixel group 410b, 430b, 450b and 470b may include two pixels of a red pixel R, a green pixel G and a blue pixel B as the chromatic pixels, and two white pixels W as the achromatic pixels. For example, each of first and fourth pixel groups 410b and 470b may include a red pixel R, a green pixel G and two white pixels W, and each of second and third pixel groups 430b and 450b may include a green pixel Q a blue pixel B and two white pixels W. Each chromatic pixel, or each of the red pixel R, the green pixel G and the blue pixel B may include a photodiode having a substantially flat upper surface and a color filter above the photodiode. At least a portion or all of the achromatic pixels, or at least a portion or all of the white pixels W may include photodiodes having nano pillar patterns with no color filter. Accordingly, the pixel array 400b of the image sensor may have high optical absorption for light having high luminance and light having low luminance, and may have a wide dynamic range.

Figure 7:
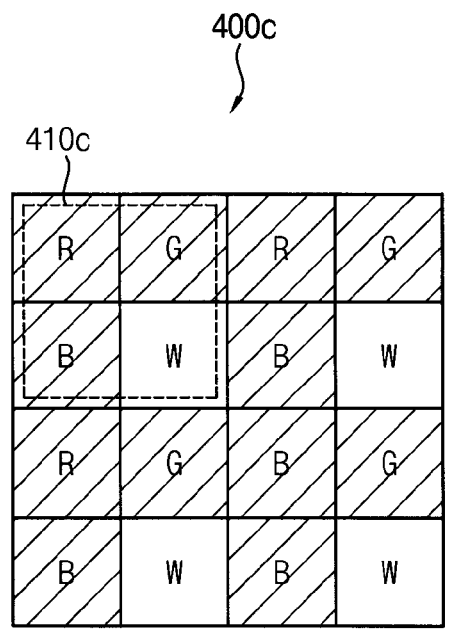
FIG. 7 is a diagram illustrating still another example of a pixel array of an image sensor according to an exemplary embodiment.

FIG. 7 is a diagram illustrating still another example of a pixel array of an image sensor according to an exemplary embodiment.

Referring to FIG. 7, a pixel array 400c of an image sensor may include a plurality of pixel groups 410c that are arranged in a matrix form having a plurality of rows and a plurality of columns.

In some exemplary embodiments, such as the exemplary embodiment illustrated in FIG. 7, each pixel group 410c may include three chromatic pixels and one achromatic pixel. For example, each pixel group 410c may include a red pixel R, a green pixel G and a blue pixel B as the chromatic pixels, and one white pixel W as the achromatic pixel. Each chromatic pixel, or each of the red pixel R, the green pixel G and the blue pixel B, may include a photodiode having a substantially flat upper surface and a color filter above the photodiode. At least a portion or all of the achromatic pixels, or at least a portion or all of the white pixels W, may include photodiodes having nano pillar patterns with no color filter. Accordingly, the pixel array 400c of the image sensor may have high optical absorption for light having high luminance and light having low luminance, and may have a wide dynamic range.

Figure 8:
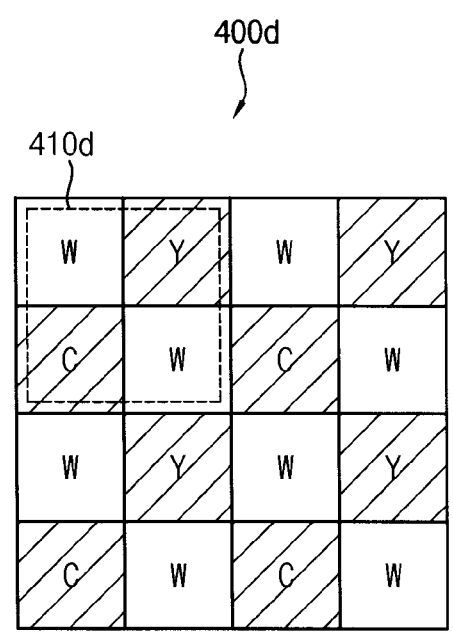
FIG. 8 is a diagram illustrating still another example of a pixel array of an image sensor according to an exemplary embodiment.

FIG. 8 is a diagram illustrating still another example of a pixel array of an image sensor according to an exemplary embodiment.

Referring to FIG. 8, a pixel array 400d of an image sensor may include a plurality of pixel groups 410d that are arranged in a matrix form having a plurality of rows and a plurality of columns.

In some exemplary embodiments, such as the exemplary embodiment illustrated in FIG. 8, each pixel group 410d may include two chromatic pixels and two achromatic pixels. For example, each pixel group 410d may include a cyan red pixel C and a yellow pixel Y as the chromatic pixels, and two white pixels W as the achromatic pixels. Each chromatic pixel, or each of the cyan red pixel C and the yellow pixel Y, may include a photodiode having a substantially flat upper surface and a color filter above the photodiode. At least a portion or all of the achromatic pixels, or at least a portion or all of the white pixels W, may include photodiodes having nano pillar patterns with no color filter. Accordingly, the pixel array 400d of the image sensor may have high optical absorption for light having high luminance and light having low luminance, and may have a wide dynamic range.

Figure 9:
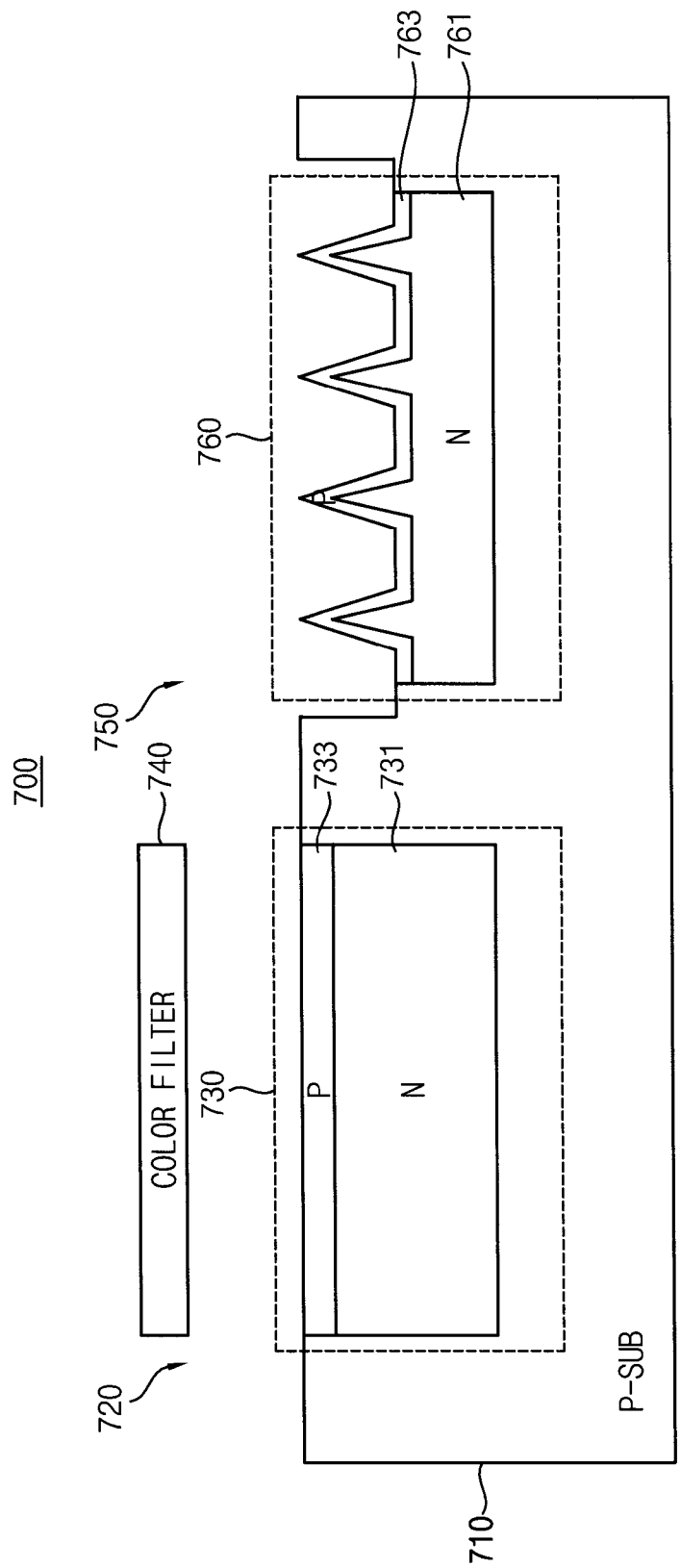
FIG. 9 is a cross-sectional diagram illustrating a chromatic pixel and an achromatic pixel included in a pixel array of an image sensor according to an exemplary embodiment.
Figure 10A:
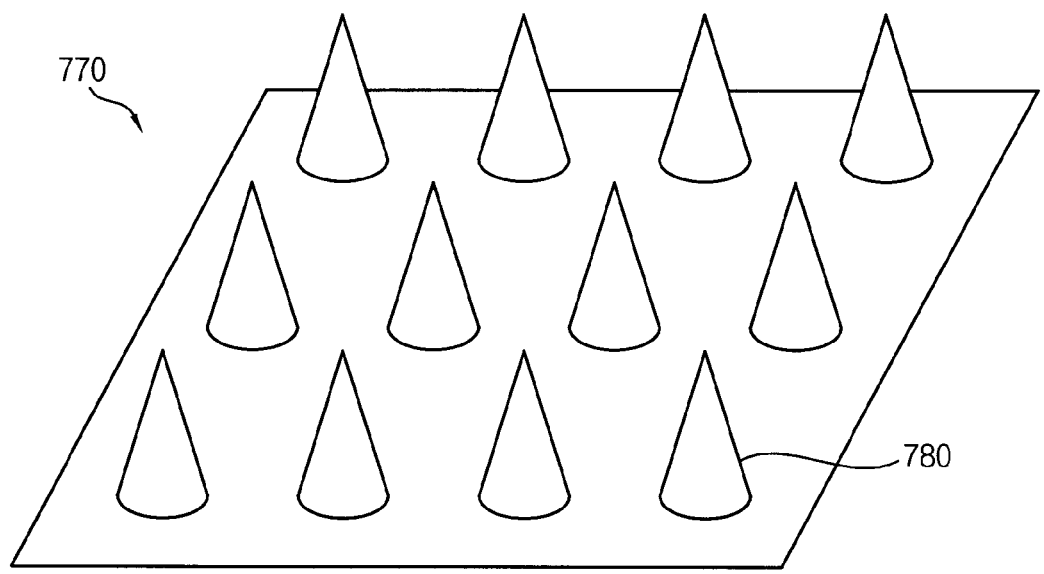
FIGS. 10A and 10B are diagrams illustrating an example of a nano pillar pattern illustrated in FIG. 9.
Figure 10B:
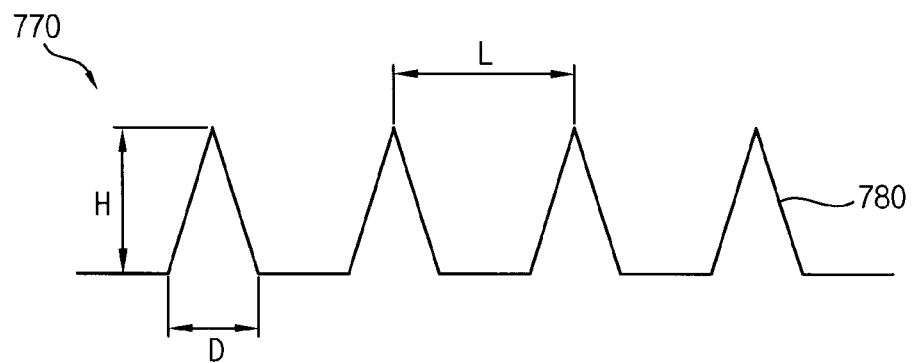

FIG. 9 is a cross-sectional diagram illustrating a chromatic pixel and an achromatic pixel included in a pixel array of an image sensor according to an exemplary embodiment, and FIGS. 10A and 10B are diagrams illustrating an example of a nano pillar pattern illustrated in FIG. 9.

Referring to FIG. 9, a pixel array 700 of an image sensor includes a chromatic pixel 720 that generates luminance information (or light-and-shade information) and color information, and an achromatic pixel 750 that generates luminance information.

The chromatic pixel 720 may include a first photodiode 730 formed in a substrate 710 and a color filter 740 formed over the first photodiode 730. The first photodiode 730 of the chromatic pixel 720 may have a substantially flat upper surface. For example, the first photodiode 730 of the chromatic pixel 720 may include a first doped region 731 having a second conductivity type formed in the substrate 710 having a first conductivity type, and the first doped region 731 may have a substantially flat upper surface. The first photodiode 730 may further include a second doped region 733 having the first conductivity type formed on the flat upper surface of the first doped region 731, and thus the second doped region 733 may also have a substantially flat upper surface. Since the first photodiode 730 of the chromatic pixel 720 has the substantially flat upper surface, the color filter 740 may be readily formed over the first photodiode 730, and a manufacturing process may be simplified.

The achromatic pixel 750 may include a second photodiode 760 formed in the substrate 710, and may not include a color filter. Since the achromatic pixel 750 has no color filter, the achromatic pixel 750 may receive incident light without optical loss by the color filter. The second photodiode 760 of the achromatic pixel 750 may have a nano pillar pattern 770 at a surface region of the substrate 710.

In some exemplary embodiments, such as the exemplary embodiments illustrated in FIGS. 10A and 10B, the nano pillar pattern 770 of the second photodiode 760 may include a plurality of conical-shaped nano pillars 780. That is, each nano pillar 780 may have a circular cone shape having a circular cross-section that gradually decreases. Each nano pillar 780 may have a nano size. For example, a diameter D of a bottom surface of each nano pillar 780 may range from about 10 nm to about 100 nm, and a height H of each nano pillar 780 may range from about 100 nm to about 1000 nm. Further, a pitch L (or a center-to-center distance between adjacent nano pillars 780) of the nano pillars 780 may range from about 30 nm to about 300 nm.

As described above, since the achromatic pixel 750 includes the second photodiode 760 having the nano pillar pattern 770, the area of the upper P-N junction of the second photodiode 760 may be increased, and the incident light scattered by the nano pillar pattern 770 may be absorbed by the second photodiode 760, thereby improving the optical absorption of the image sensor according to exemplary embodiments and improving the dynamic range.

Figure 11:
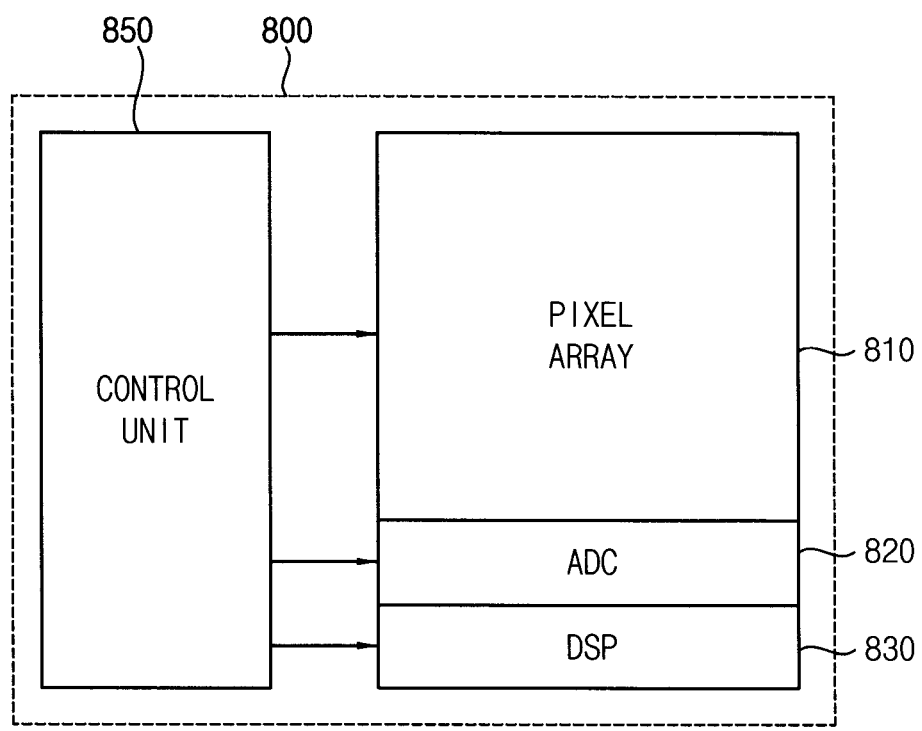
FIG. 11 is a block diagram illustrating an image sensor according to an exemplary embodiment.

FIG. 11 is a block diagram illustrating an image sensor according to an exemplary embodiment.

Referring to FIG. 11, an image sensor 800 includes a pixel array 810 and a control unit 850. In some exemplary embodiments, the image sensor 800 may further include an analog-to-digital converting (ADC) unit 820 and a display signal processing (DSP) unit 830.

The pixel array 810 may include a chromatic pixel that generates luminance information (or light-and-shade information) and color information, and an achromatic pixel that generates luminance information. The chromatic pixel may include a first photodiode formed in a substrate and a color filter formed over the first photodiode, and the achromatic pixel may include a second photodiode having a nano pillar pattern at a surface region of the substrate. As described above, since the chromatic pixel and the achromatic pixel have different shapes from each other, and the second photodiode of the achromatic pixel has the nano pillar pattern, the image sensor 800 according to an exemplary embodiment may have high optical absorption with respect to not only light having high luminance, but also light having low luminance, and may have a wide dynamic range.

The ADC unit 820 may convert an analog signal output from the pixel array 810 into a digital signal. According to exemplary embodiments, the ADC unit 820 may perform a column ADC that converts analog signals in parallel using a plurality of analog-to-digital converters respectively coupled to a plurality of column lines. In other exemplary embodiments, the ADC unit 820 may perform a single ADC that sequentially converts the analog signals using a single analog-to-digital converter.

In some exemplary embodiments, the ADC unit 820 may further include a correlated double sampling (CDS) unit for extracting an effective signal component. In some exemplary embodiments, the CDS unit may perform an analog double sampling that extracts the effective signal component based on a difference between an analog reset signal including a reset component and an analog data signal including a signal component. In other exemplary embodiments, the CDS unit may perform a digital double sampling that converts the analog reset signal and the analog data signal into two digital signals and extracts the effective signal component based on a difference between the two digital signals. In still other exemplary embodiments, the CDS unit may perform a dual correlated double sampling that performs both the analog double sampling and the digital double sampling.

The DSP unit 830 may receive a digital image signal output from the ADC unit 820, and may perform image data processing on the digital image signal. For example, the DSP unit 830 may perform image interpolation, color correction, white balance, gamma correction, color conversion, etc. Although FIG. 11 illustrates an example where the DSP unit 830 is included in the image sensor 800, according to exemplary embodiments, the DSP unit 830 may be located outside the image sensor 800.

The control unit 850 may control the pixel array 810, the ADC unit 820 and the DSP unit 830. The control unit 850 may provide the pixel array 810, the ADC unit 820 and the DSP unit 830 with control signals, such as a clock signal, a timing control signal, etc. In some exemplary embodiments, the control unit 850 may include a control logic circuit, a phase locked loop circuit, a timing control circuit, a communication interface circuit, etc.

The image sensor 800 may further include a row decoder that selects a row line of the pixel array 810, and a row driver that activates the selected row line. In some exemplary embodiments, the image sensor 800 may further include a column decoder that selects one of a plurality of analog-to-digital converters included in the ADC unit 820, and a column driver for providing an output of the selected analog-to-digital converter to the DSP unit 830 or an external host.

Figure 12:
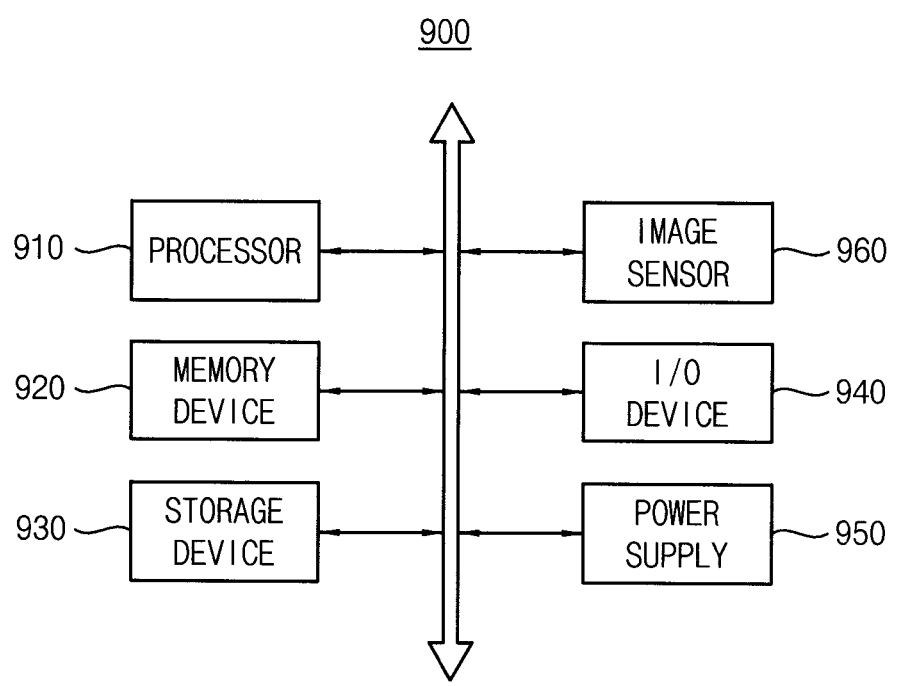
FIG. 12 is a block diagram illustrating an electronic device according to an exemplary embodiment.

FIG. 12 is a block diagram illustrating an electronic device according to an exemplary embodiment.

Referring to FIG. 12, an electronic device 900 includes a processor 910, a memory device 920, a storage device 930, an input/output device 940, a power supply 950 and an image sensor 960. Although not illustrated in FIG. 12, the electronic device 900 may further include a port for communicating with electronic devices, such as a video card, a sound card, a memory card, and/or a USB device, among others.

The processor 910 may perform specific calculations and/or tasks. For example, the processor 910 may be a microprocessor, a central processing unit (CPU), a digital signal processor, or the like. The processor 910 may communicate with the memory device 920, the storage device 930 and the input/output device 940 via an address bus, a control bus and/or a data bus, among others. The processor 910 may be coupled to an extension bus, such as a peripheral component interconnect (PCI) bus. The memory device 920 may store data for operating the electronic device 900. For example, the memory device 920 may be implemented as a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), and/or a ferroelectric random access memory (FRAM), among others. The storage device 930 may include a solid state drive, a hard disk drive, a CD-ROM, or the like. The input/output device 940 may include an input device, such as a keyboard, a mouse, a keypad, etc., and an output device, such as a printer, a display device, or the like. The power supply 950 may supply power to the electronic device 900.

The image sensor 960 may be coupled to the processor 910 via the buses or other desired communication links. As described above, the image sensor 960 may include a chromatic pixel that generates luminance information (or light-and-shade information) and color information, and an achromatic pixel that generates luminance information. The chromatic pixel may include a first photodiode formed in a substrate and a color filter formed over the first photodiode, and the achromatic pixel may include a second photodiode having a nano pillar pattern at a surface region of the substrate. As described above, since the chromatic pixel and the achromatic pixel have different shapes from each other, and the second photodiode of the achromatic pixel has the nano pillar pattern, the image sensor 960 according to exemplary embodiments may have high optical absorption with respect to not only light having high luminance, but also light having low luminance, and may have a wide dynamic range. According to some exemplary embodiments, the image sensor 960 and the processor 910 may be integrated in one chip, and/or may be implemented as separate chips.

According to some exemplary embodiments, the image sensor 960 and/or components of the image sensor 960 may be packaged in various desired forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP) and/or wafer-level processed stack package (WSP), among others.

The electronic device 900 may be any computing system including the image sensor 960. For example, the electronic device 900 may be implemented as a digital camera, a mobile phone, a smart phone, a personal digital assistant (PDA), a portable multimedia player (PMP), a personal computer, a server computer, a workstation, a laptop computer, a digital television, a set-top box, a music player, a portable game console, and/or a navigation system, among others.

Figure 13:
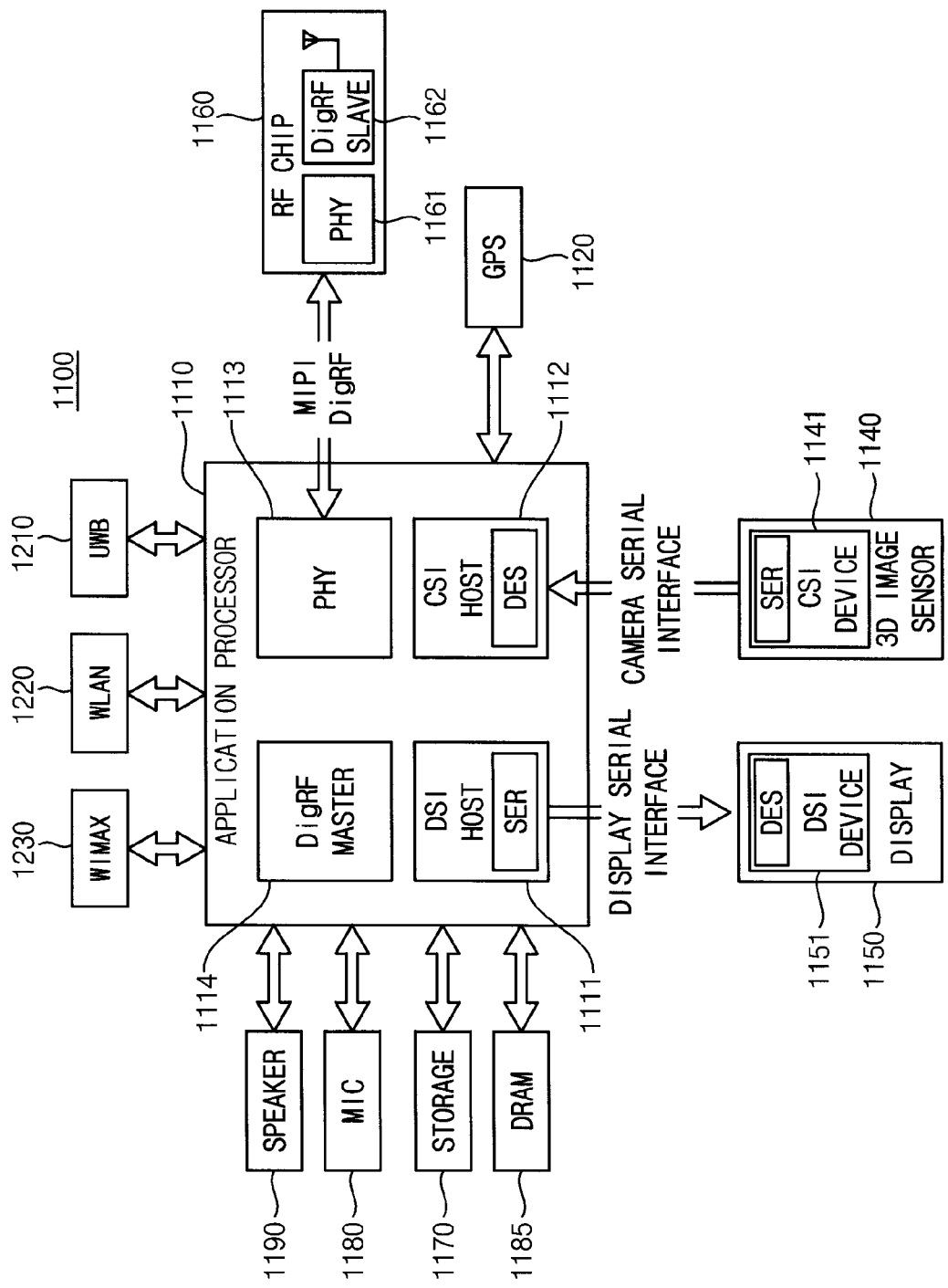
FIG. 13 is a block diagram illustrating an example of an interface used in an electronic device of FIG. 12.

FIG. 13 is a block diagram illustrating an example of an interface used in an electronic device of FIG. 12.

Referring to FIG. 13, an electronic device 1100 may employ or support a MIPI interface, and may include an application processor 1110, an image sensor 1140 and a display device 1150. A CSI host 1112 of the application processor 1110 may perform a serial communication with a CSI device 1141 of the image sensor 1140 using a camera serial interface (CSI). The CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). The DSI host 1111 may include a serializer SER, and the DSI device 1151 may include a deserializer DES.

The electronic device 1100 may further include a radio frequency (RF) chip 1160. A physical layer PHY 1113 of the application processor 1110 may perform data transfer with a physical layer PHY 1161 of the RF chip 1160 using a MIPI DigRF. The PHY 1113 of the application processor 1110 may interface with (e.g., communicate with) a DigRF MASTER 1114 for controlling the data transfer with the PHY 1161 of the RF chip 1160. The electronic device 1100 may further include a global positioning system (GPS) 1120, a storage device 1170, a microphone 1180, a DRAM 1185 and/or a speaker 1190. The computing system 1100 may communicate with external devices using an ultra wideband (UWB) communication 1210, a wireless local area network (WLAN) communication 1220, and/or a worldwide interoperability for microwave access (WIMAX) communication 1230, among others. However, exemplary embodiments are not limited to the configurations or interfaces of the electronic devices 900 and 1100 illustrated in FIGS. 12 and 13.

Some exemplary embodiments may be used in any image sensor or any device including the image sensor, such as a computer, a digital camera, a three-dimensional camera, a mobile phone, a personal digital assistant (PDA), a scanner, a navigator, a video phone, a monitoring system, an auto focus system, a tracking system, a motion capture system, and/or an image stabilizing system, among others.

The foregoing is illustrative of exemplary embodiments and is not to be construed as limiting the scope thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A pixel array of an image sensor, the pixel array comprising:
a substrate;
a chromatic pixel comprising a first photodiode formed in the substrate and a color filter formed over the first photodiode; and
an achromatic pixel comprising a second photodiode formed in the substrate, the second photodiode having a nano pillar pattern at a surface region of the substrate,
wherein the first photodiode comprises:
a first doped region having a second conductivity type, the first doped region being formed in the substrate having a first conductivity type, the first doped region comprising a flat surface; and
a second doped region having the first conductivity type, the second doped region being formed on the flat surface of the first doped region.

2. The pixel array of claim 1, wherein the nano pillar pattern comprises a plurality of cylindrical-shaped nano pillars.

3. The pixel array of claim 2, wherein a diameter of each of the cylindrical-shaped nano pillars ranges from about 10 nm to about 100 nm, and a height of each of the cylindrical-shaped nano pillars ranges from about 100 nm to about 1000 nm.

4. The pixel array of claim 2, wherein a pitch between two of the plurality of nano pillars ranges from about 30 nm to about 300 nm.

5. The pixel array of claim 1, wherein the nano pillar pattern comprises a plurality of conical-shaped nano pillars.

6. The pixel array of claim 1, wherein the nano pillar pattern comprises a plurality of nano pillars each having a polygonal cylinder shape or a polygonal cone shape.

7. The pixel array of claim 1, wherein the second photodiode comprises:
a third doped region having a second conductivity type, the third doped region being formed in the substrate having a first conductivity type, the third doped region comprising a surface having a shape corresponding to the nano pillar pattern; and
a fourth doped region having the first conductivity type, the fourth doped region being formed on the surface having the shape corresponding to the nano pillar pattern.

8. The pixel array of claim 1, wherein the chromatic pixel is configured to generate luminance information and color information, and the achromatic pixel is configured to generate luminance information.

9. The pixel array of claim 8, wherein a dynamic range of the luminance information generated by the achromatic pixel is wider than a dynamic range of the luminance information generated by the chromatic pixel.

10. The pixel array of claim 1, wherein the pixel array comprises at least one of a red pixel, a green pixel and a blue pixel as the chromatic pixel, and at least one white pixel as the achromatic pixel.

11. The pixel array of claim 1, wherein the pixel array comprises at least one of a cyan pixel and a yellow pixel as the chromatic pixel, and at least one white pixel as the achromatic pixel.

12. An image sensor, comprising:
a substrate;
a pixel array comprising a chromatic pixel and an achromatic pixel, the chromatic pixel comprising a first photodiode formed in the substrate and a color filter formed over the first photodiode, the achromatic pixel comprising a second photodiode formed in the substrate, and the second photodiode having a nano pillar pattern at a surface region of the substrate; and
a control unit configured to control the pixel array,
wherein the first photodiode comprises:
a first doped region having a second conductivity type, the first doped region being formed in the substrate having a first conductivity type, the first doped region comprising a flat surface; and
a second doped region having the first conductivity type, the second doped region being formed on the flat surface of the first doped region.

13. The image sensor of claim 12, wherein the nano pillar pattern comprises a plurality of nano pillars, each of the nano pillars having a circular cylinder shape, a circular cone shape, a polygonal cylinder shape or a polygonal cone shape.

14. The image sensor of claim 12, wherein:
wherein the second photodiode comprises:
a third doped region having the second conductivity type, the third doped region being formed in the substrate, the third doped region comprising a surface having a shape corresponding to the nano pillar pattern; and
a fourth doped region having the first conductivity type, the fourth doped region being formed on the surface having the shape corresponding to the nano pillar pattern.

15. A pixel array, comprising:
a substrate;
a chromatic pixel comprising a first photodiode formed in the substrate and a color filter spaced apart from the substrate, the first photodiode having a first surface formed at a side of the substrate closest to the color filter, the first surface facing the color filter; and
an achromatic pixel comprising a second photodiode formed in the substrate, the second photodiode having a second surface formed at the side of the substrate closest to the color filter, which corresponds to a neighboring chromatic pixel,
wherein the first surface and the second surface have different shapes, and
wherein the first photodiode comprises:
a first doped region having a second conductivity type, the first doped region being formed in the substrate having a first conductivity type, the first doped region comprising a flat surface; and
a second doped region having the first conductivity type, the second doped region being formed on the flat surface of the first doped region.

16. The pixel array of claim 15, wherein the first surface is flat and the second surface comprises alternating protrusions and indentations.

17. The pixel array of claim 16, wherein the protrusions are cylindrically shaped.

18. The pixel array of claim 16, wherein the protrusions are conically shaped.

19. The pixel array of claim 15, wherein the shape of the second surface is configured to scatter light incident thereon.

* * * * *